(12) United States Patent
Ramesh et al.

(10) Patent No.: US 9,854,712 B1
(45) Date of Patent: Dec. 26, 2017

(54) SELF-CONTAINED POWER AND COOLING DOMAINS

(71) Applicant: Google Inc., Mountain View, CA (US)

(72) Inventors: Anand Ramesh, Sunnyvale, CA (US);
Jimmy Clidaras, Los Altos, CA (US);
Christopher G. Malone, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 15/273,218

(22) Filed: Sep. 22, 2016

Related U.S. Application Data

(63) Continuation of application No. 14/336,691, filed on Jul. 21, 2014, now Pat. No. 9,483,090.

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *F01K 19/10* | (2006.01) |
| *F01D 15/10* | (2006.01) |

(52) U.S. Cl.
CPC ......... *H05K 7/20745* (2013.01); *F01D 15/10* (2013.01); *F01K 19/10* (2013.01); *F05D 2220/31* (2013.01)

(58) Field of Classification Search
CPC . G06F 1/189; G06F 1/20; G06F 1/203; G06F 1/206
USPC .... 361/679.46, 679.47, 724–727; 312/223.1, 312/223.2, 223.3
See application file for complete search history.

(56) References Cited

U.S. PATENT DOCUMENTS

| | | | |
|---|---|---|---|
| 8,842,430 B2 * | 9/2014 | Hellriegel | G06F 1/183 361/679.46 |
| 2010/0191378 A1 * | 7/2010 | Gilon | F24J 2/38 700/275 |
| 2011/0154842 A1 * | 6/2011 | Heydari | H05K 7/20836 62/259.2 |
| 2012/0139250 A1 * | 6/2012 | Inman | E21B 21/10 290/52 |
| 2014/0038510 A1 * | 2/2014 | Bailey | H05K 7/20745 454/339 |

* cited by examiner

*Primary Examiner* — Anthony Haughton
(74) *Attorney, Agent, or Firm* — Fish & Richardson P.C.

(57) ABSTRACT

A method for providing for conditioning of a computer data center includes supplying a working fluid from a common fluid plane to a plurality of power/cooling units distributed across a data center facility in proximity to electronic equipment that is distributed across the data center facility; converting the working fluid into electric power and cooling capacity at each of the plurality of power/cooling units; and supplying the electric power to a common electric power plane serving a plurality of racks of the electronic equipment in the data center facility and being served by a plurality of the power/cooling units in the data center facility, wherein the common fluid plane serves at least 10 percent of the power/cooling units in the data center facility and the common electric power plane serves at most 5 percent of the electronic equipment in the data center facility.

20 Claims, 8 Drawing Sheets

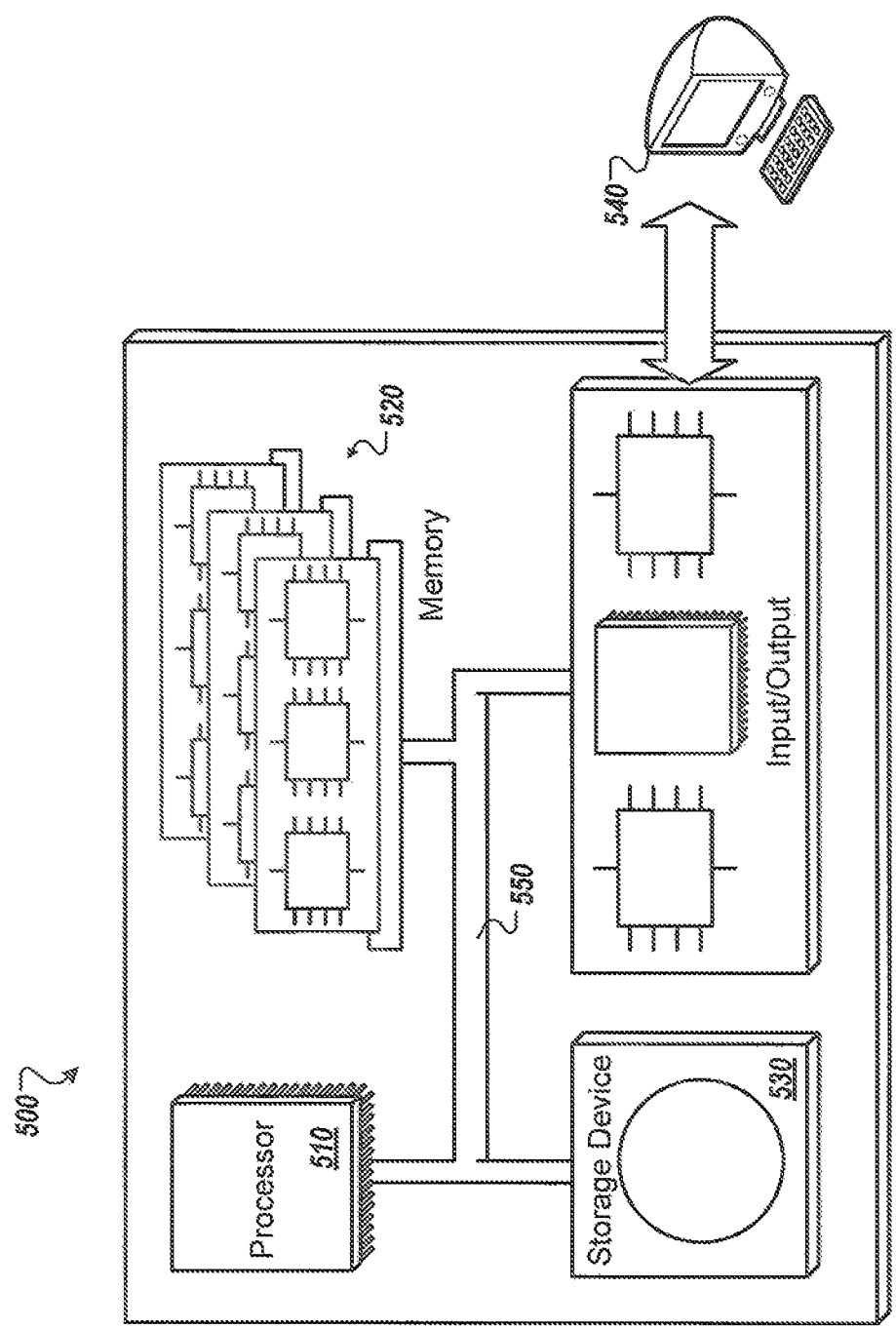

SELF-CONTAINED POWER AND COOLING DOMAINS

CROSS-REFERENCE TO RELATED APPLICATIONS

This application is a continuation of U.S. patent application Ser. No. 14/336,691, entitled "SELF-CONTAINED POWER AND COOLING DOMAINS," filed Jul. 21, 2014, which is incorporated herein by reference in its entirety.

TECHNICAL FIELD

This document relates to systems and methods for providing power and cooling for areas containing electronic equipment, such as computer server racks and related equipment in computer data centers.

BACKGROUND

Economical and flexible provision of electric power and cooling is an important aspect of modern large-scale computer data centers. Such data centers may house thousands, hundreds of thousands, or even millions of computer servers mounted in numerous rows of computer racks, and those computers may be used for a variety of computing functions. The computers use electric power to perform the computations and other related activities, and the power usage is relatively dense (megawatts of power in a single facility). As a result, the computer servers and related components generate a large amount of heat. For example, a pair of microprocessors mounted on a single motherboard can draw 200-400 watts or more of power. Multiply that figure by several thousand (or tens of thousands) to account for the many computers in a large data center, and one can readily appreciate the amount of heat that can be generated.

While the cost of generating the heat (in terms of electrical usage) can be high for a data center, the cost of removing all of the heat can also be high. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause great increases in microprocessor errors and failures. In sum, such a system may require electricity to run the chips, and more electricity to cool the chips.

SUMMARY

This disclosure describes systems and methods that may be employed to provide electric power within a data center facility and to remove heat that is created at least in part through the use of that power by computers and associated equipment. In certain implementations, combination power/cooling units may be distributed relatively evenly throughout a data center and close to the computer systems that need to be powered and cooled. Each power/cooling unit may receive energy from a working fluid such as steam, and may use that working fluid to generate electricity. The output of such a generator system, other than the electricity, may then be used to operate a cooling unit. For example, the steam may be converted into very hot water and can be used to operate an absorption chiller or other cooling unit.

As noted, the power/cooling units may be widely dispersed within a data center, with, for example, a unit for each row of computer racks or more than one unit per row of racks. For example, the units may be mounted above a row of racks—either from the ceiling structure of the data center or mounted to the top of each rack. The units may also be mounted in certain racks themselves and may be positioned between racks of computers to provide electricity and cooling to the adjacent computer racks. In yet other examples, the units may be mounted below an elevated floor and provide electricity and cooling to the racks of computers above them. The relationship between power/cooling units and racks of computers may be 1-to-1, 1-to-n, or n-to-1. Waste heat from the units may be ducted into a plenum and then removed from a facility, such as by providing stacks running upward from each unit into an enclosed attic space or down into an underfloor warm-air plenum, either of which may be exhausted outdoors.

The various distributed units may also receive their working fluid from a single large fluid plane or domain. A plane or domain, in this context, is an area through which an energy source (e.g., steam, natural gas, or electricity) may flow naturally and readily, without being blocked by structures such as valves, switches, transformers, and other components. The benefits of having a relatively large common plane include an ability of energy to move readily from areas where it is not demanded to areas where it is. Thus, for example, by providing distributed power units like those discussed here throughout a data center facility, and tying the inputs of those units into a large single plane, working fluid can move readily to units that are serving racks that have a high current demand. Also, higher variability in demand may be accommodated with less energy-generating capability, and overall utilization of energy generation in a facility may be higher.

The size of the electric power domains may be similarly large or substantially smaller than the working fluid domain. Where the electric power domain is large (e.g., of the same size as the working fluid domain, such as a majority of a data center facility), the outputs of multiple distributed power units may be tied together so that electricity can flow freely within and through the larger domain. Where the electric power domains are relatively small in size (e.g., serving only a single-digit number of racks) and large in number, the failure domains on the electrical side may be kept equally small. Thus, if a failure occurs in the electrical distribution for a particular domain, it will be automatically isolated and not affect electrical energy delivery to equipment served from other of the domains. In certain implementations, automatic switches may be provided within a particular domain and normally left closed, and then if a failure occurs in a part of the domain, the location of the failure may be identified, and the switches may be opened under control of a central control system so as to isolate the failure into a small part of the system so that operation of equipment that was previously in the same domain as the failure may again be operated before the failure can be diagnosed and fixed.

In an example implementation, a method for providing for conditioning of a computer data center includes supplying a working fluid from a common fluid plane to a plurality of power/cooling units distributed across a data center facility in proximity to electronic equipment that is distributed across the data center facility; converting the working fluid into electric power and cooling capacity at each of the plurality of power/cooling units; and supplying the electric power to a common electric power plane serving a plurality of racks of the electronic equipment in the data center facility and being served by a plurality of the power/cooling units in the data center facility. The common fluid plane serves at least 10 percent of the power/cooling units in the data center facility and the common electric power plane serves at most 5 percent of the electronic equipment in the data center facility.

In a first aspect combinable with the general implementation, the common fluid plane serves at least 50 percent of the power/cooling units in the data center facility and the common electric power plane serves at most 5 percent of the electronic equipment in the data center facility, and wherein the data center facility is rated at 10 MW or more.

In a second aspect combinable with any of the previous aspects, the common fluid plane serves at least 90 percent of the power/cooling units in the data center facility and the common electric power plane serves at most 10 percent of the electronic equipment in the data center facility, and wherein the data center facility is rated at more than 10 MW.

In a third aspect combinable with any of the previous aspects, the power/cooling units include an electric generator unit generating power from the working fluid and supplying waste from the working fluid to a cooling unit that supplies cooling fluid to cool the electronic equipment.

In a fourth aspect combinable with any of the previous aspects, the working fluid includes steam and the waste includes hot water produced from the steam.

In a fifth aspect combinable with any of the previous aspects, the electric generator includes a steam turbine.

In a sixth aspect combinable with any of the previous aspects, the cooling unit includes an absorption chiller.

In a seventh aspect combinable with any of the previous aspects, the electric generator unit and the cooling unit are located in a unitary housing with each other.

In an eighth aspect combinable with any of the previous aspects, the unitary housing is located within a row of racks that include the one or more racks of computers.

In a ninth aspect combinable with any of the previous aspects, the unitary housing is located above a row of racks that includes the one or more racks of computers.

A tenth aspect combinable with any of the previous aspects further includes exhausting heat from the power/cooling units to an area external to the data center.

In another general implementation, a system includes a plurality of power/cooling units distributed across a data center facility in proximity to electronic equipment that is distributed across the data center facility; a common working fluid plane defined by a plurality of interconnected conduits arranged to serve a plurality of the power/cooling units; and a common electric energy plane defined by a plurality of interconnected electric conductors and served by a plurality of the power/cooling units. The common working fluid plane serves at least 10 percent of the power/cooling units in the data center facility and the common electric power plane serves at least 10 percent of the electronic equipment in the data center facility.

In a first aspect combinable with the general implementation, the common fluid plane serves at least 50 percent of the power/cooling units in the data center facility and the common electric power plane serves at least 50 percent of the electronic equipment in the data center facility, and wherein the data center facility is rated at more than 10 MW.

In a second aspect combinable with any of the previous aspects, the common fluid plane serves at least 90 percent of the power/cooling units in the data center facility and the common electric power plane serves at least 90 percent of the electronic equipment in the data center facility, and wherein the data center facility is rated at more than 10 MW.

In a third aspect combinable with any of the previous aspects, the power/cooling units include an electric generator unit generating power from the working fluid and supplying waste from the working fluid to a cooling unit that supplies cooling fluid to cool the electronic equipment.

In a fourth aspect combinable with any of the previous aspects, each of the plurality of power/cooling units includes an electric generator unit arranged to receive a working fluid and generate electricity using the working fluid; a conduit connected to receive waste from the electric generator unit that is generated from the working fluid; and a cooling unit connected to receive the waste from the conduit and to providing cooling for one or more computers.

In a fifth aspect combinable with any of the previous aspects, the electric generator unit includes a steam turbine and the waste includes hot water produced form the steam.

In a sixth aspect combinable with any of the previous aspects, the cooling unit includes an absorption chiller.

In a seventh aspect combinable with any of the previous aspects, the electric generator unit and the cooling unit are located in a unitary housing with each other.

In an eighth aspect combinable with any of the previous aspects, the unitary housing is include in a rack arranged to be positioned in a row of computer racks.

In a ninth aspect combinable with any of the previous aspects, the cooling unit includes an input positioned to obtain hot air from computer racks and to supply cooled air to the same computer racks.

In a tenth aspect combinable with any of the previous aspects, a hot air input for the cooling unit is located on a first side of the housing, and a cool air output for the cooling unit is located on a second side of the housing that is opposite the first side of the housing.

In an eleventh aspect combinable with any of the previous aspects, the unitary housing is located above a row of racks that includes the one or more racks of computers.

A twelfth aspect combinable with any of the previous aspects further includes an exhaust connecting the unitary housing to an area external to the data center.

In a thirteenth aspect combinable with any of the previous aspects, the exhaust includes a conduit connected to a hot air plenum in an attic above, or an under-floor space below, racks of computers in a data center.

The details of one or more embodiments are set forth in the accompanying drawings and the description below. Other features, objects, and advantages will be apparent from the description and drawings, and from the claims.

DESCRIPTION OF DRAWINGS

FIG. 5 is a schematic diagram of a computer system that can be used for the operations described in association with any of the computer-implement methods described herein.

DETAILED DESCRIPTION

This document generally describes devices, and systems of multiple devices, that can provide distributed power generation and cooling in a data center. Such devices may include both an electrical generator sub-system and a cooling sub-system, where the two sub-systems obtain power from a single working fluid. For example, the working fluid may be steam and the electric generator sub-system may include a steam turbine connected to a generator. The steam may turn partially or wholly into hot water in passing through the turbine, and such hot waste water can be passed to an absorption chiller that can be used to provide cooling to the same computer. The two sub-systems may be joined in a single common package within a common single housing, and may be procured together as a single enclosed unit having a fluid input and electrical and ventilated cool-air outputs.

The inputs of the devices, the outputs of the device, or both, may be tied together into a large common energy plane, where the energy source (e.g., steam or electricity) can flow readily and naturally across the entire domain without interference from components placed in the domain (such as switches, valves, transformers, etc.). For example, the working fluid, electrical power, or both, may occupy a domain that is more than a majority, more than 75%, or more than 90% of the coverage for an entire data center facility, where such facility may have IT loads of 10, 20, 30, 40, 50, 75, 90, 100, or 200 MW, or any range between any two of these numbers (e.g., a range of 75 to 100 MW). Also, the working fluid may occupy a similar large domain, while the electric power created from the working fluid in that domain may be confined to a relative large number of smaller domains. For example, the ratio of electric power domains to working fluid domains may be 5:1, 10:1, 20:1, 50:1, 100:1, 250:1, 500:1, or 1000:1, or any range between any of those two ratios such as between 10:1 and 100:1.

As one example, a data center facility may have a working fluid domain larger than 25 or 50 MW, and the average electric domain served by that working fluid domain for generating the electricity being smaller than 1 MW, smaller than 0.5 MW, and smaller than 0.25 MW. As noted above, such relatively small electric domains may reduce the size of failure domains there is a problem with electric power generation and/or distribution, so that a relatively large portion of a facility remains operational if there is an electric power failure.

Figure 1A:
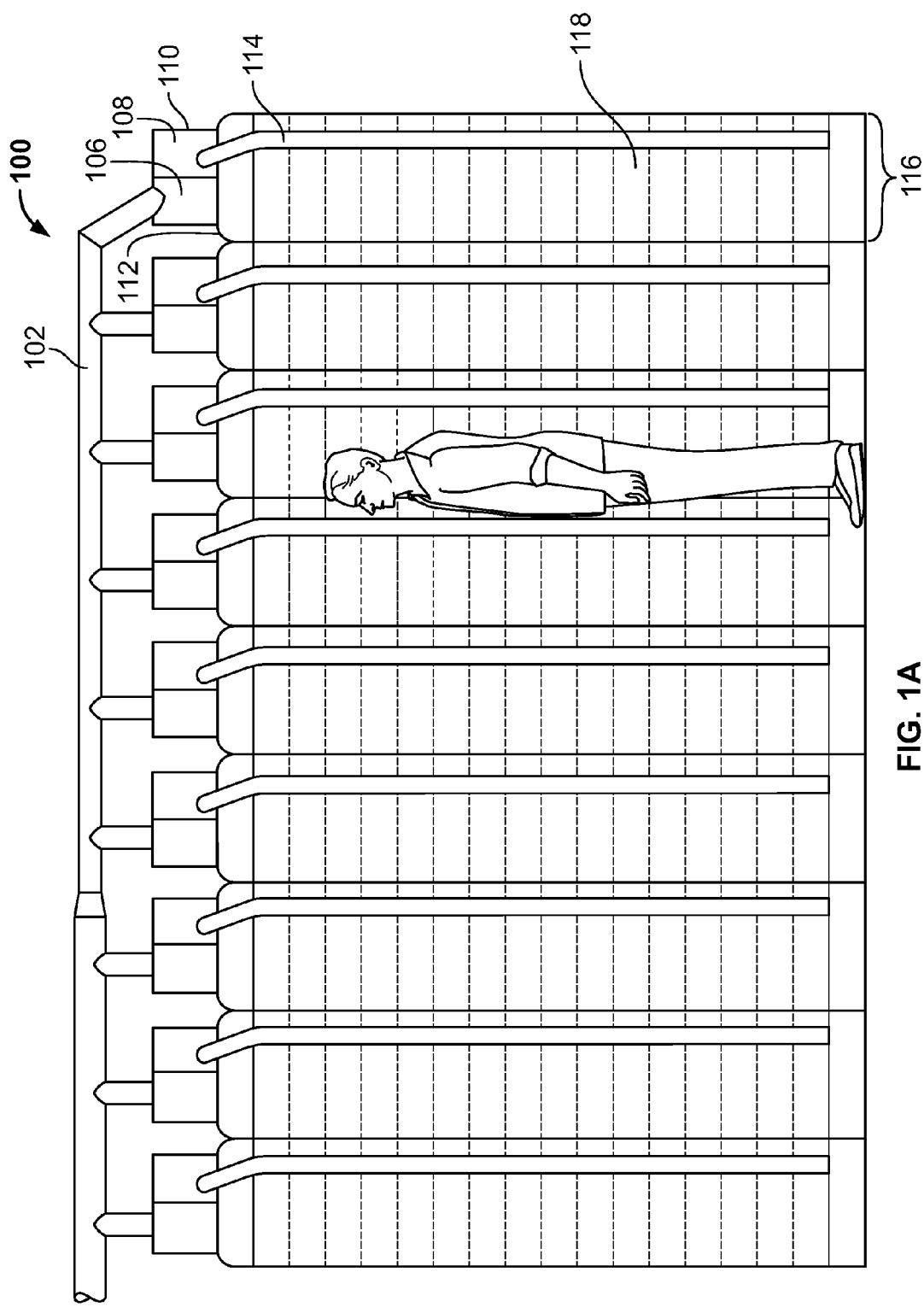
FIGS. 1A-1C are elevation views of example power and cooling units that may be used in a data center environment.
Figure 1B:
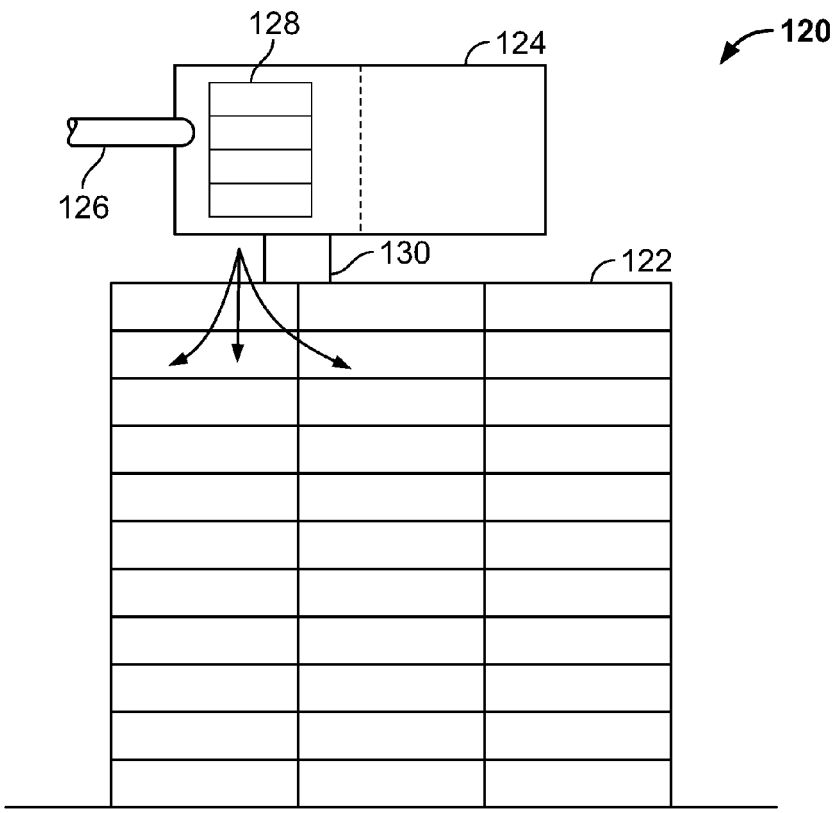
Figure 1C:
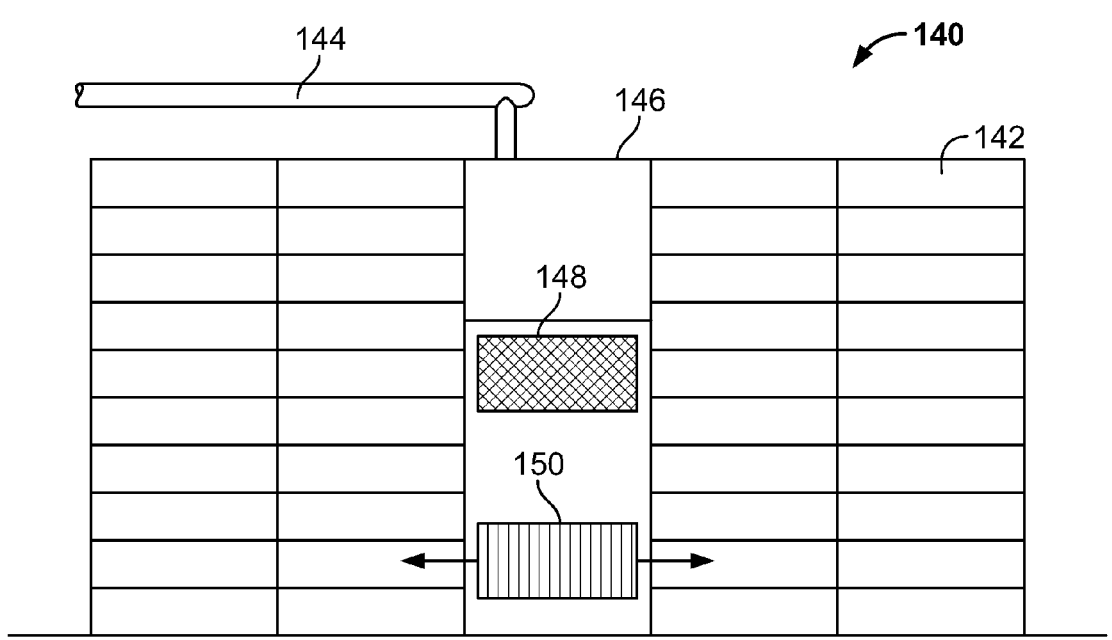

FIGS. 1A-C are elevation views of example power and cooling units that may be used in various systems in a data center environment. FIG. 1A shows, in particular, power/cooling units that are mounted above a row of racks 100. As shown in the figure, the racks, exemplified by rack 116 and positioned side-by-side in the row 100, hold a plurality of trays that are each slid into open fronts of the respective racks and that each support one or more motherboards to which are mounted or otherwise connected microprocessors and other support chips and other components for operating as computer servers in a typical data center arrangement. An open-air space may be left between each adjacent tray in a vertical stack of trays so as to permit air to circulate around heat-generating components in each tray, so as to create convective cooling. Alternatively, or in addition, one or more portions of the components supported by each of the motherboards may be in contact with a thermally conductive solid material, such as an aluminum block, and such a solid material may be liquid cooled, so as to provide conductive heat removal from the components.

The racks may take other configurations and hold other components in appropriate implementations. For example, networking equipment, power supplies, and other components needed to support computers in the various racks may also be mounted in the same racks as the computers, or in other ones of the racks, such as in every N. racks in a row. Also, although the computers are shown in this example as being horizontally positioned on trays that are slid into the open fronts of the racks like lunch trays in cafeteria racks, the motherboards and computers may take other forms, such as blade servers and similar configurations. Electrical and data connections may be made to the computers on the front side, such as by way of data jacks provided on each motherboard, or on the back side, such as in the form of tight-fit blade mounting connections into which the motherboards are each slid.

An area behind the row of racks may be used as a warm air capture plenum for a data center. For example, cool air may enter each of the racks on a front side that is shown in the figure, may pass over components in the rack, and may exit the rack at a back side that is opposite to the front side. The area behind each of the racks may be enclosed so as to form such a warm air plenum that receives the air from each of the racks of computers. In certain implementations, and as shown in more detail below, the warm air plenum may be positioned between two rows of racks that are parallel to each other, and may therefore receive warm air simultaneously from both rows of racks.

Each rack may be made up of one or more vertical stacks of computers or other components. A rack in such an example is considered to be an individually movable component, such as one mounted on caster wheels, that may be slid into place in a row of racks or may be removed, such as when replacing or performing maintenance on computers in the rack. In some examples, each rack may include three stacks, and each stack may include 10, 20, 30, 40, or more trays, or a number of trays in a range between any two of those values. The racks may be of a height that maximizes density within a data center facility, while being convenient to move, deploy, and service. For example, the racks may each be a height of about 5 feet, 7 feet, 8 feet, 9 feet, or 10 feet tall, or a height that is between any two of such heights.

Each rack in this example, and each stack also, may receive electrical power service and cooling service from a dedicated and local power/cooling unit exemplified by power/cooling unit 110. In this example, the power/cooling unit 110 is mounted above its corresponding rack 116, such as by being physically attached to the top of rack 116 and thus may be movable with rack 116, or by being mounted to the structure of the data center and then connected to appropriate components of rack 116 when rack 116 has been moved into position under the power/cooling unit 110.

The power/cooling unit 110 is made up of a single housing, which may be approximately the size of a hotel refrigerator, and may be prepackaged and installed by simply hooking up input and output connections for the power/cooling unit 110. Within the housing for the power/cooling unit 110, may be two zones, which may be separate or may overlap each other in some manners. A first zone is an electrical generation section 106, in which is located a mechanism for converting a powering fluid carried in conduit 102 into motion and a generator for producing electricity from that motion. For example, a steam turbine or other form of turbine may be included in the electrical generation section 106 and may be used to power a generator.

A cooling section 108 of the power/cooling unit 110 may include a system for cooling one or more fluids (e.g., circulating air) that are heated by the components in the racks such as rack 116. The cooling section 108 may, for example, cool air and/or water that is used to in turn cool the components in the rack 116. For example, the cooling section 108 may include an absorption chiller that may create cooling from residual steam or hot water that is a waste product or byproduct of the electrical generation section 106. For example, a conduit appropriately sized may connect a steam turbine in the unit 110 to an absorption chiller in the unit 110 so that waste heated fluid can be carried to the cooling section 108 to be used in providing cooling. Appropriate drains may also be included for removing water that is waste that may be generated by the absorption chiller.

A conduit 114 is shown leading downward from the cooling section 108, and is exemplary of similar structures that may be positioned at each rack or bay. The conduit 114 may take the form of a pipe where the cooling section 108 delivers cooling water, or a duct where the cooling section 108 delivers cooled air. For example, where conduction cooling is being used in the rack 116, the conduit 114 may have cooling water circulated through it and may be connected to heat sink blocks that are in contact with each computer in the rack 116. Although not shown, a separate conduit may be used to carry warm water out of each heat sink block and back up to cooling section 108. Where conduit 114 is a duct, air may be distributed through apertures located at each tray in the rack 116, and additional dispersal of cool air may be achieved by attaching dispersal wands to the conduit 114, where each wand may be rotated into position in front of the rack 116 and a corresponding tray in the rack 116.

Each such wand may thus be in a horizontal position when in use, and apertures spread across the length of each wand may distribute cool air in the space in front of the corresponding tray. The air may then be drawn into the rack and may pass over the respective tray so as to cool electrical components that are supported by that tray. When maintenance is needed on a particular tray, the corresponding wand may be rotated upward or downward into a vertical position so as to be removed from interfering with removal of a tray or motherboard supported by a tray.

In this manner, localized cooling may be provided to each tray in the rack and in certain implementations, control may be provided at each wand (e.g., via a motorized damper) so as to permit more granular control over where cooled air is provided in a system. For example, a control system may be made aware of a level of computer processing that is being performed or is to be performed by a particular server or servers in a tray, and a control valve may be adjusted on a damper for a corresponding wand so as to provide a level of airflow commensurate with the level of computing that will be performed, and by extension with a level of heat that will be generated in the particular tray.

Referring now to FIG. 1B, there is showing a single packaged power/cooling unit 124 as part of a system 120 that generates heat and requires electricity and cooling. In this example, the unit may be like unit 110 in FIG. 1A, though here, the unit serves an entire 3-by rack rather than simply a single bay. In certain implementations, the unit 124 may serve the rack 122 that is shown and a corresponding rack that backs up to rack 122 (and those view is blocked in this representation by rack 122).

The unit 124 is served with a working fluid, such as steam or hydrogen or natural gas, by conduit 126. Such working fluid may initially be employed to generate electricity which may be provided to computers in rack 122 by way of electrical conductors (not shown). For example, a power strip may be provided vertically at each location where two bays of a rack meet each other, and power cords may be plugged into the power strip for each motherboard in a rack. The power strip may in turn have a conductor or conductors that run from it to one or more outlets in the unit 124.

A supply duct 130 is showing extending downward from the unit 124 to a warm air aisle behind rack 122. Such a warm air area may be enclosed, and may be located behind rack 122 and behind a corresponding rack that is behind rack 122. As such, cool air may enter through an open front of rack 122, flow across motherboards and electronic heat-generating components in rack 122, and pass out the back of rack 122 and into the warm air space. The duct 130 may then bring the warm air up to unit 124 where it may be cooled by a cooling system that is part of unit 124 and that runs off of the remains of the working fluid that is introduced into unit 124 (after that working fluid is first used to generate electricity).

The cooled air may be released by way of diffuser 128, which faces in the same direction as the front of the bays in the rack 122. The cooled air may then be drawn into the front portions of each part of the rack 122 and circulated across the electronic equipment to be heated again. Such circulation may occur continuously, with the electronic equipment in the rack 122 heating the air, and the unit 214 cooling the air. In other implementations, air from the warm air aisle may be exhausted outside of a facility, and the unit 124 may draw air directly from the outside (e.g., via a duct), or from the main occupied area of the data center, where makeup air may be provided from outdoors to replace any warm air that is exhausted outdoors. Additional fans and other components may be located in appropriate areas to encourage such airflow, such as small fans at the back of each tray in the rack 122, and fans having low delta pressure at louvers that allow air into the data center, such as large propeller fans and similar forms of fans.

Referring now to FIG. 1C, a system 140 is shown in which a combined power/cooling unit 146 is located in line with a row of racks rather than above the role of racks. In general, such an implementation may take up space that would otherwise be occupied by computers and other electronic equipment, but may also be easier to access and maintain, and may provide for a larger form factor of unit 146, and thus potentially additional cooling from unit 146.

In the system 140, a rack 142 is shown that has two bays, and is adjacent the unit 146. Another rack having two bays is shown on an opposed side of unit 146. As in the other figures, the racks have open fronts so that air from a workspace of a data center may be readily drawn into areas around electronic componentry in the racks and cool such componentry with a minimum air pressure drop.

The unit 146 includes an air intake 148 and air output 150, where generally, air would exit through the air output 150 at a substantially lower temperature than it entered via the air intake 148. The intake 148 and output 150 may be on a same side of the unit 146 or on different sides, such as the output 150 being on a side that faces a human-occupied cold aisle and the intake 148 on an opposite side from the output and receiving air from a hot aisle that is located behind the rack 142. As with the rack in FIG. 1B, the rack 142 and other racks can be located in a longer row of racks (e.g., like that shown in FIG. 1A) that may back up to the backs of a parallel row of racks, though with a hot aisle in between the parallel rows. In certain embodiments, chimneys or other ducts may extend upward from the unit 146 and/or the hot aisle, and may terminate above a roof of the data center or may terminate in a hot attic that collects hot air from multiple aisles and that may in turn be vented to the outdoors so that hot air may be immediately removed from a data center and not be circulated. In such a situation, make-up air may be introduced into the data center facility, such as via louvers along one wall of the facility, perhaps aided by fans, and provided with humidification as appropriate upon the air entering the facility.

Figure 1D:
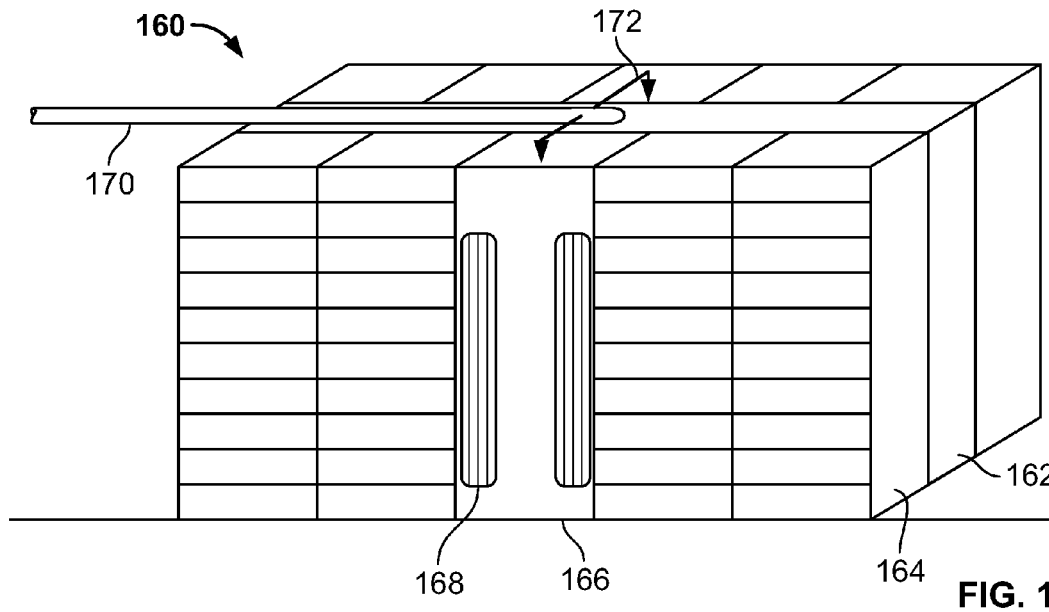
FIG. 1D is a perspective view of paired rows of computer racks having power and cooling units.

FIG. 1D is a perspective view of paired rows of computer racks having power and cooling units. In the figure, a system 160 is shown in part for a data center, where a pair of rows of racks is shown but should be understood to be one of multiple similar paired rows across the width of a data center. The arrangement in this example is similar to that shown in FIG. 1C, though shown in perspective to better illustrate the exemplary arrangement of components in the data center.

The system 160 includes a pair of rows of computer racks, where each rack is made up of two bays. A first row 164 backs up to a hot air aisle 162, which is enclosed and sealed so that air in the hot air aisle does not mix with air in the occupied space above and in front of the row 164 and other rows. Centered between the two racks shown in row 164 is a combined power/cooling unit 166, which occupies an entire bay in the row 164. Each of the racks and the unit 166 may be mounted on casters or wheels that may be retracted or locked once they are moved in position in the row 164. The unit 166 is provided with a pair of linear diffusers 168 which may supply cooled air into an area of a human-occupied aisle in the data center, for circulation through the human-occupied area and into the computers mounted in the racks. The diffusers 168 may extend almost a full height of the racks so as to provide cooled air evenly at all vertical levels so that no motherboards in the racks are starved of cool air.

The unit 166 houses both an electric generation subsystem which may take a form similar those described above and below, and a cooling sub-system, which may also take a form like those described above and below. In this example, the diffusers 168 are shown as terminating short of the top of the unit 166 because, for example, the unit 166 may have electrical generating equipment in its top portion that blocks the extension of the diffusers 168 all the way to the top of the unit 166.

The unit 166 is served by a take off 172 in the form of a scheme conduit that is attached to a main 170. Main 170 may in turn be attached and receive steam from a larger header that may extend laterally across the end of a data center and across multiple different pairs of rows of racks, where a main light main 170 extends parallel with each of the racks, such as above a human occupied or above 162. The steam or other conduits may be insulated or otherwise protected to prevent damage and to prevent condensation or leaks that may otherwise drip onto sensitive electronic equipment in the racks 164.

Figure 1E:
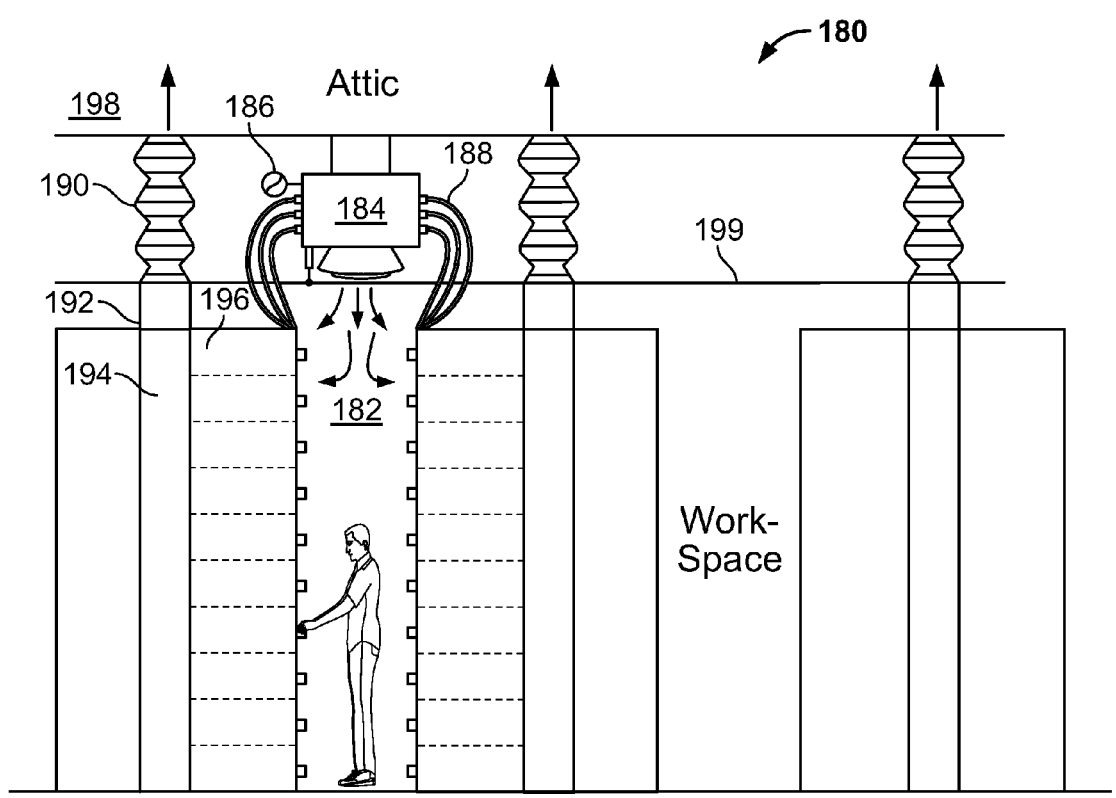
FIG. 1E is an elevation view of an example power and cooling installation.

FIG. 1E is an elevation view of an example power and cooling installation 180. In general, the installation 180 is an example in which a combined power/cooling unit 184 may be installed over a human-occupied aisle 182 in a data center facility. Although one exemplary unit 184 is shown, multiple such units would be distributed relatively evenly across the entire facility in a typical implementation, with typically multiple units in each aisle of the facility. In a typical implementation, the units may be spaced so as to minimize the amount of ductwork or other cool-air distribution mechanisms that will be needed, such that each unit is relatively proximate to computer racks and other equipment that it serves cool air to.

As shown in the figure, a technician is located in the cool air aisle 182 performing maintenance on computers in a rack 196. As with the other examples discussed above, the rack 196 may have an open front, with individual motherboards lying horizontally, and spaced apart from each other vertically, so that air may enter through the front of the rack 196, pass through the rack between the motherboards, and pass into a warm air plenum 194. The plenum 194 is positioned between the backs of adjacent rows of computer racks and receives warmed air from such adjacent roads.

A fan 192 is located at a top surface of the warm air plenum 194, which may be sealed from the cool air aisle 182 and other areas of the workspace in the facility. The fan 192 may draw air from the warm air plenum 194 and push the air three flexible duct 190 into an attic space 198. Each such warm air plenum 194 may have multiple such fans 192 along its length, with the number of fans been selected to match a volume of airflow needed through the racks served by the respective fans and into the attic 198. In other embodiments, the warm air plenum 194 may be connected to the attic space 198 along its entire length, rather than with relatively small individual ducts like duct 190. In additional implementations, air from the warm air plenum 194 may be routed downward into an under-floor space. In yet other implementations, attic space 198 may be omitted, and the air may be exhausted directly out of the data center facility to the outdoors.

Different levels of air may be recirculated exhausted and or brought in fresh, to replace air that is removed from the warm air plenum 194. For example, cooling coils may be provided to receive air from the attic space 198, cool the air, and return the air to the workspace. Such coils may be part of unit 184, where a duct (not shown) may lead upward from unit 184 into attic space 198 to draw such air for recirculation. In other implementations, some or all of the air in attic space 198 may be exhausted to the outdoors, and unit 184 may obtain some or all of its supply air from the workspace (and the workspace may obtain outdoor air).

The unit 184 is shown supplying electrical power to rack 196 and other racks by way of conductors 188. In one implementation, the unit 184 may have electrical outlets mounted to it outer surface so that whips or cords 188 may be connected to it and connected down to power strips that run along the edge of rack 196. Individual conductors may then lead from the power strip or strips to particular ones of the computers in the rack. The power supplied by unit 184 may be alternating current power, direct current power or a combination of the two, where some outputs provide alternating current power and other outlets provide direct current power.

A conductor 199 is shown attached to an additional outlet from unit 184. The conductor 199 may in turn be connected in like manner to other such combined power/cooling unit in a facility. Current may be allowed to flow in the conductor and to be selectively provided or used by ones of the units that currently have excess capacity or need excess capacity for electrical power. For example, at a particular moment in time, computers in rack 194 and any other racks served by unit 184 may require more electric power than unit 184 is capable of providing. In such a situation, unit 184 may be controlled to supplement the power it provides to its associated racks with power drawn from conductor 199. In other situations, unit 184 may provide power to conductor 199 which may be used by other units within the facility.

Unit 184 is served with a working fluid conduit 186. Such conduit 186 may carry, for example, steam or natural gas or another source of energy that may be converted into electricity and cooling by unit 184. As with conductor 199, conduit 186 may connect across multiple units, and may connect to a header that serves multiple rows of units. In this manner, just as conductor 199 a part of a large power plane from unit 184 to other units to which the conductor 199 is connected, the conduit 186 may likewise be in a large plane for the provision of the working fluid. As such, a network of conduits may supply the working fluid flexibly in response to immediate demands for such fluid, with the fluid flowing readily and naturally across the common plane of conduits. As noted above, such use of common planes may increase the utilization level for a facility, and decrease the capital costs and sizes of distribution systems inside the facility. In addition, where cooling units are distributed across a facility, the facility may be implemented without a need for duct work and other cool-air distribution components that would be needed with a central air handling unit or similar system. An example system showing large working fluid to electrical domains is illustrated in more detail below with respect to FIG. 3C.

While the use of working fluid and electrical interconnections across units in a system via large energy planes has been discussed most particularly with respect to the system shown in FIG. 1E, such interconnection may equally apply to the systems shown in FIGS. 1A to 1D in similar manner.

Figure 2:
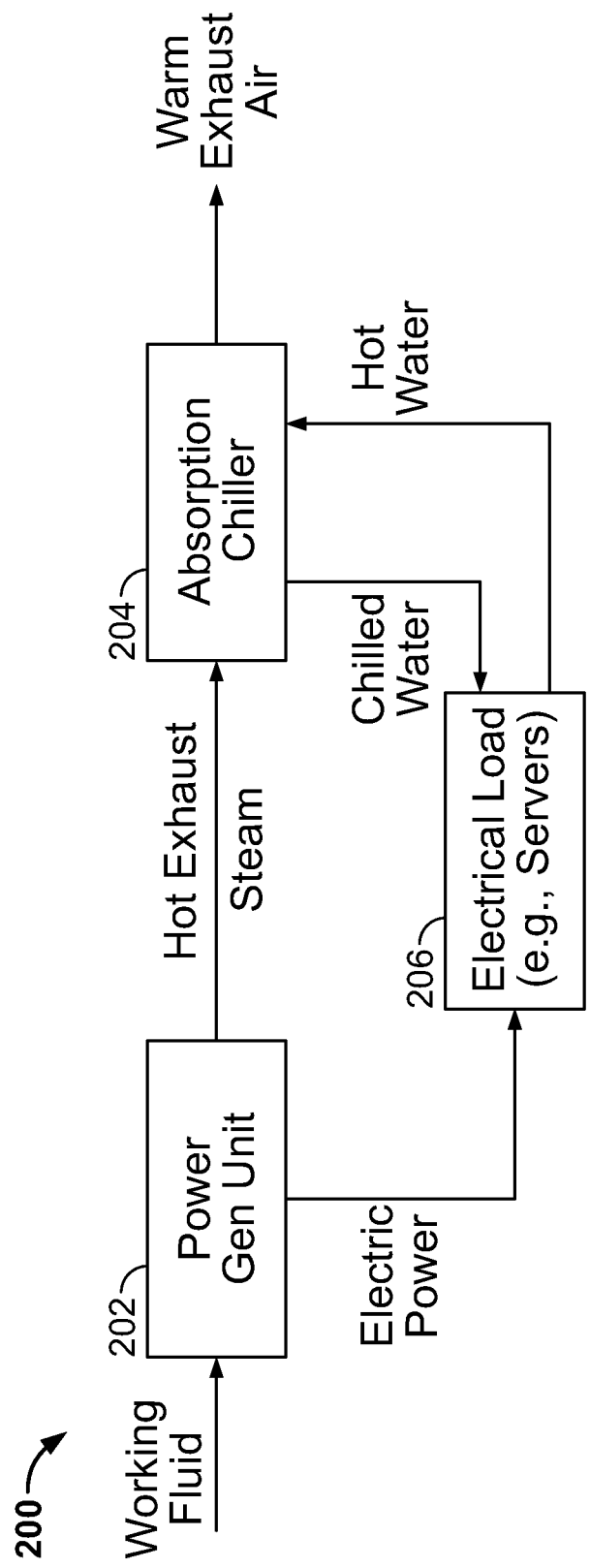
FIG. 2 is a schematic diagram of a power-cooling unit.

FIG. 2 is a schematic diagram of a power-cooling unit 200. In general, the figure shows, broadly, subsystems that may be part of unit 200, and the inputs and outputs of each such sub system.

Within a units 200, there may be located a power generation unit 202 and an absorption chiller tool for. The two may be mounted in a common unitary housing, and may be manufactured in a conventional manner and shipped to a site for installation at the site where a data center is located. In other implementations, each such subunit may be mounted in its own housing, and the two subunits may be connected directly to each other or connected near each other by way of a conduit and other connecting mechanisms.

The power generation unit 204 receives an import a working fluid, such as steam, natural gas, or hydrogen. The power generation unit 202 may include a mechanism for converting the working fluid into motion, such as rotational motion to drive a generator, fuel cell, or other generator of electricity. One output of power generation unit 202 is electric power, which may then be provided to electrical loads 206, such as servers, networking equipment, and other electrical loads within a data center facility. The electric power may take the form of old voltage AC or DC power, such as power a level of 460 V or lower. In some implementations, the power may be generated at a first voltage and stepped down to one or more other voltages before being provided to the electrical loads 206. For example, our may be generated a level in excess of 100 V initially, and maybe stepped down to a level below 12 V for supply to the electrical loads 206. Such stepped down in voltage may occur inside the unit that houses the power generation unit 202, in one or more power supply is located between the electrical loads 206 and the power generation unit 202, or a combination of the two, such as an initial step down in voltage of occurring in the power generation unit 202 and additional step downs occurring in separate power supplies.

A second output of the power generation unit 202 is waste from the electric generation process, such as hot exhaust steam of a lower pressure than the steam that entered the power generation 202 and a lower temperature. Alternatively, or in addition, to the provision of steam, hot water may also be passed from power generation unit 202 to absorption chiller 204. The Georgian chiller 204 uses the hot entering fluid as part of a cooling cycle to create cooling for hot water that is provided to the absorption chiller 204 from the electrical loads 206. For example, a cooling coil may be provided that receives chilled water or cool water from absorption chiller 204 and returns heated water to absorption chiller 204, while receiving heated air from an area around the electrical loads 206, and providing cooled air to the electrical loads 206. The particular spacing and positioning of the power generation unit 202, the absorption chiller 204, and the electrical loads 206 to each other may take a form similar to that shown in the figures discussed above, or other particular forms depending on the needs of a particular implementation.

The units 202 and 204 may be controlled by a local controller and a central control system. Such control may be mediated by signals received from the electrical loads 206. For example, computers in a computer rack may determine that amount of processing that they are performing and will perform in the near future and may provide a signal indicating a level of cooling load that will accompany such processing. Such signaled may then be used by the unit 200 in order to modulate the operation of the power generation unit 202 and the absorption chiller 204. Advantageously, increases in a need for an electric power should also increase the amount of fluid that is consumed by the electric generation unit 200 2N plus supplied to the absorption chiller 204, so that additional capacity in cooling will generally match additional needs for cooling. In other implementations, temperature sensors may alternatively or additionally be provided in an area around the electrical loads, and reading from such sensors may be used to modulate the operation of the unit 200.

The various control mechanisms just discussed may communicate to and from a central control system along with similar mechanisms for other portions of a computer data center. The central control system may operate to maximize utilization of computing and cooling resources in a data center facility, and allocate processing loads and bus cooling loads across such a facility. For example, the central control system may ensure that computing loads do not exceed maximum levels for electrical use or for cooling capacity of different units within a data center. The central control system may particularly even out the amount of computing is performed by particular rack in a data center, so that spot Dean does not occur and exceed acceptable limits on temperatures in the computer data center.

Figure 3A:
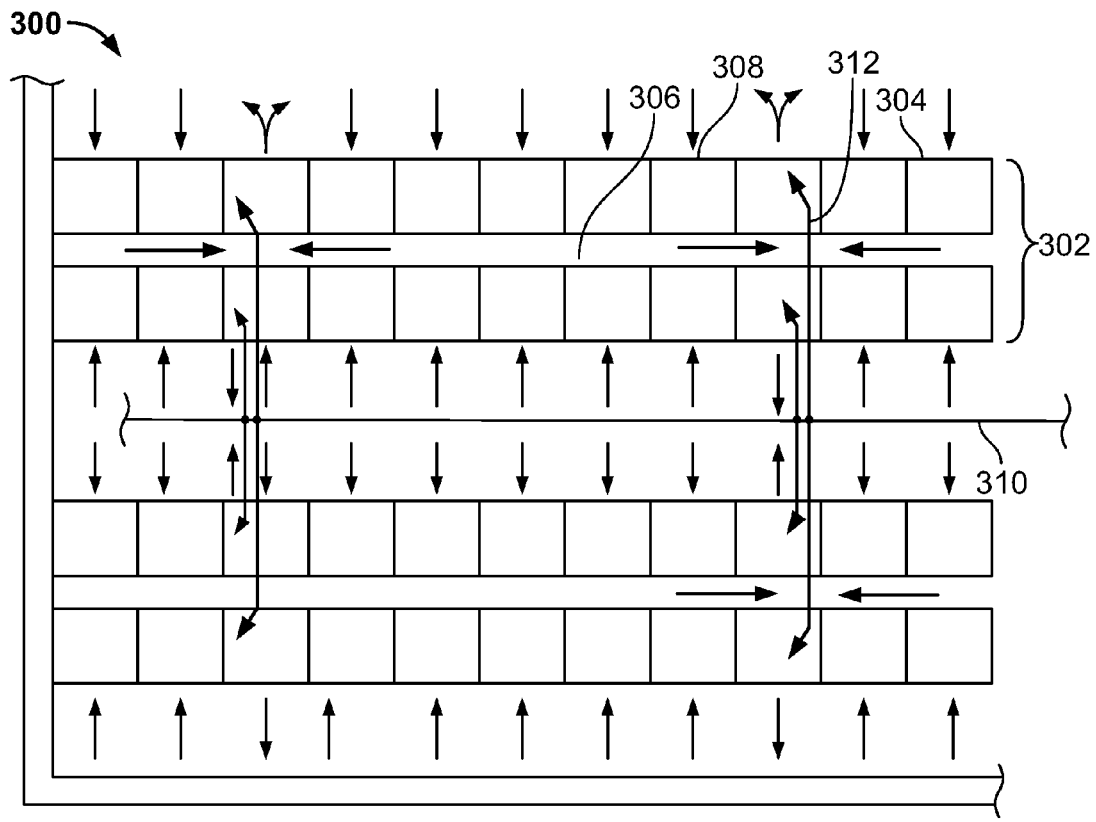
FIGS. 3A and 3B show plan views of data centers using distributed power-cooling units.
Figure 3B:
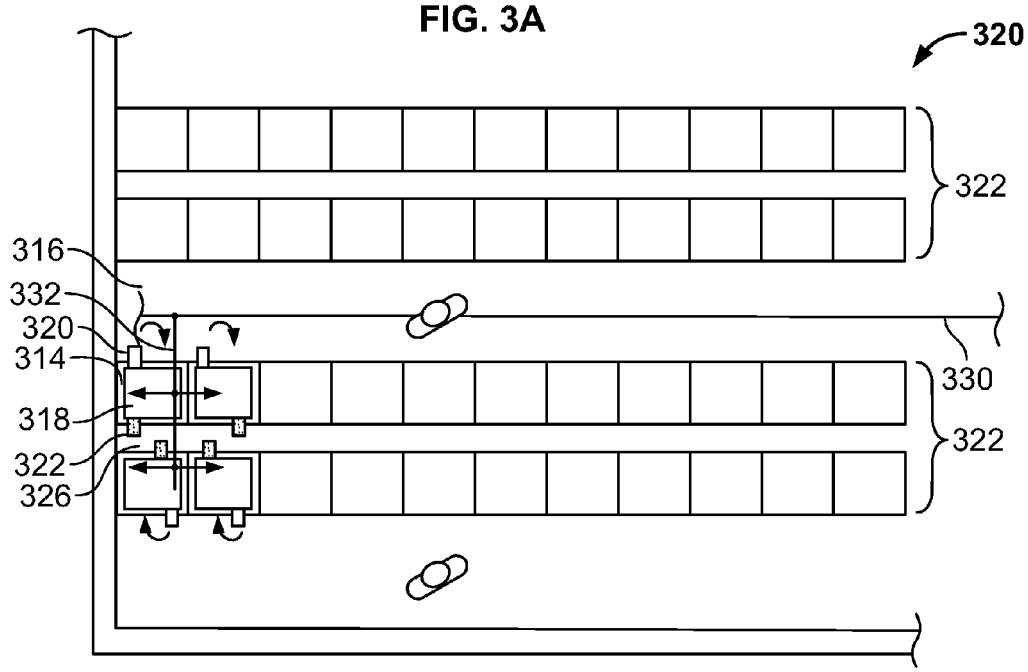

FIGS. 3A and 3B show plan views of data centers using distributed power-cooling units. In general, the figures show implementations similar to those in FIGS. 1A-D, though "zoomed out" to show more complete versions of rows of racks and to show a plan view so as to better indicate the positional relationship between the components in such a system.

Referring now to FIG. 3A, there is shown a pair of rows of racks, including first pair 302. Pair 302 includes two parallel rows of racks that each back up to an enclosed warm air aisle 306. As shown by arrows in the figure, air may enter racks in each such row, such as rack 304, from a front face of the racks, and may exit through an opposed back face of the racks into the warm air aisle 306. Located at periodic points in each of the rows are combined power/cooling units such as unit 308. Each such unit is served by a fluid-carrying conduit 312, such as a take-off from a steam pipe system, and steam main 310. The fluid from conduit 312 may be used to power an electrical generation subunit in unit 308, and a cooling subunit in unit 308. Arrows show air exiting unit 308 into a human-occupied aisle in the data center, and such cooled air may then be drawn back into the various racks including rack 304. Air for unit 308 may be obtained from the human-occupied aisle or from the warm air aisle 306. In some implementations, air from the warm air aisle 306 may be exhausted outdoors rather than being recirculated, such as by being routed upward from the aisle and into a warm air attic which may then be exhausted through various forms of roof vents.

Thus, in this manner, steam main 310 and associated piping may replace all or substantially all need for cool-air distribution componentry, such as duct work, and electrical distribution componentry, such as bus ducts and other similar items, in the data center. Although certain air and electrical distribution may still be needed, the use of distributed local cooling units and power generation units may substantially reduce the need for expensive, and potentially hard-to-maintain, electrical and air distribution systems.

Referring now to FIG. 3B, there is shown a plan view of a system 320 that provides cooling units above rows of racks rather than in the same level as the rows of racks as shown in FIG. 3A. In FIG. 3B, there is shown two pairs 322 of rows of racks similar to those shown in FIG. 3A. A human-occupied aisle 316 is provided between the fronts of the adjacent rows of racks, and a warm air aisle is provided between the backs of the next-adjacent rows of racks, which warm air aisle is sealed from the human-occupied area of cooler air. Two technicians are shown standing in two of the human-occupied aisles to better represent the layout of such system.

A steam main 330 or other conduit for delivering a powering fluid is shown mounted above the human-occupied aisle 316. A takeoff 332 from the steam main 330 extends over the bottom pair of rows of racks and serves combined power/cooling units that are mounted above each bay in the racks. Only one such takeoff 332 is shown here for clarity, though it would be understood that each of the other bays would be served in a similar manner, and the structures shown here would be repeated for each such other bay.

Referring now more specifically to units at each particular bay, combined power/cooling unit 318 is positioned over a corresponding bay and includes a duct 322 that angles downward into warm air aisle 326, and a supply duct 320 that angles to supply cooled air into an area in front of the corresponding b. Other similar units may be arranged in a similar manner. In this example, each bay is assigned its own corresponding unit. In other implementations, each unit may supply multiple bays.

In some implementations, a combined power/cooling unit may serve racks in the same row in addition to racks in multiple rows, including racks in a particular pair of rows that are joined back to back by a warm air aisle, or racks that face each other across a human-occupied aisle. For example, multiple combined power/cooling units may be situated above the human-occupied aisle 316 for easy access for purposes of maintenance and other use, and may blow cool air downward into the human-occupied aisle 316 and obtain outside air from ductwork that extends upward to roof-mounted air intakes or other supplies of outdoor air. Such units may then have outlets for receiving electrical cords that may extend to each side of the human-occupied aisle to power strips that are mounted on the fronts of particular racks in the human-occupied aisle 316. Multiples of such units may then be spaced along the human occupied aisle 316 as needed, where cooling and electric capacity of each unit is matched to corresponding cooling and electrical usage density of the electronic components in the data center along the aisle.

Figure 3C:
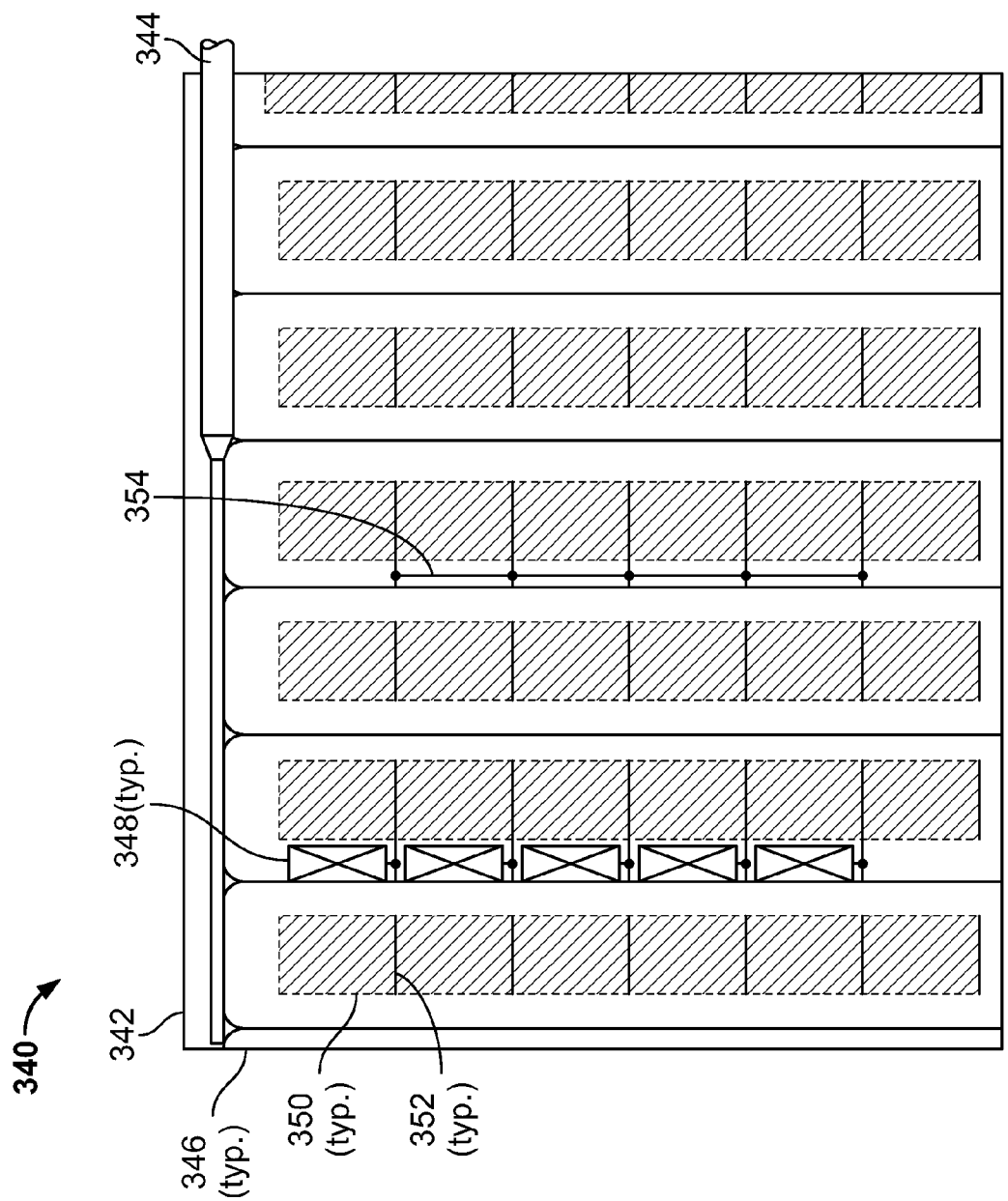
FIG. 3C shows an example of a large-domain distributed power and cooling installation.

FIG. 3C shows an example of a large-domain distributed power and cooling installation 340. The installation here shows a plan view of particular components in a datacenter facility 342, which is served by a distributed grid of combined power/cooling units like unit 348.

In this example, rows of racks 350 are shown in dashed lines in the figure, and may be similar to the racks shown in FIGS. 1A-1E. In this example, the racks sit on slab, though they may also be mounted on an elevated floor with open space beneath or concrete with space beneath (and where mechanical components may be routed under such floor rather than above the racks).

Mounted higher than the racks (or below the floor) are a grid of combined power/cooling units like unit 348, which may be similar to those units discussed above, such as by including a sub-unit for generating electric power from a fluid such as steam or hydrogen, and a sub-unit for generating cooling from the waste products of the first sub-unit, such as an absorption chiller. One row of such units is shown here over an aisle between rows of racks, so that technicians may easily access the units via lift or ladder, and so that the units to not drip on or otherwise interfere with the computers and other electronic equipment in the racks. An equal arrangement of units may be located above each of the other aisles also, so that the units form an X-by-Y grid of units.

A fluid conduit main 344 is shown entering the facility 342 at one corner and running as a header across the open workspace area at the end of the various aisles. Taps such as conduit 346 take off from the main 344 at each aisle between rows of racks and extend along such aisles and above the racks (though the conduits 346 could also be below the floor). At each of the units, another tap may be taken (e.g., via flexible connector) to unit so as to serve the working fluid to the respective unit. Although isolation valves may be provided in the conduits, e.g., to allow cutting off a section of the data center facility during maintenance, the conduits may generally be left freely open to each other during normal operation, so that working fluid may flow freely across the entire facility or a substantial portion of the facility in response to units demanding such fluid in a particular area of the facility 342. The particular arrangements of each unit and connections from a working fluid supply to a unit may take a variety of forms, such as each of those shown above in FIGS. 1A-1E.

The unit 348 is connected to an electric bus 352, which in turn may be connected (via electrical connector 354) to other electric buses in the facility. Again, although switches and other components may be provided for isolating portions of the electric service from each other, in normal operation, a single open plane of power may be provided (as was the case with the working fluid) so that power can flow freely across the plane to where it is needed. In this example, the bus ducts are shown running perpendicular to the conduits and aisles, though they may also be routed in parallel with such other components or in other positional arrangements. In addition, the bust ducts may be connected to the individual units so as to receive power from or provide power to individual units, as needed by such units. Appropriate components may be provided in each unit to control such provision or use of electric power, and a central control system may provide coordinated control for the use of such power. For example, particular racks may be allocated amounts of processing they may perform in a given future time period, based on an anticipated amount of electric power needed to perform the operations and a level of power within the plane allocated to a unit that corresponds to a particular rack.

As noted above, such management of electrical power in a data center can provide more flexibly by additionally, or alternatively, providing the data center with a very large power plane for a data center, or a small number (e.g., 1-10) of relatively large planes (e.g., 5 MW, 10 MW, 20 MW, 25 MW, or 50 MW, or any number between any pair of these levels, e.g., between 10 and 25 MW). In particular, transformers and other equipment are frequently employed in a data center and block the free flow of electrical power from one area of the data center to another as it is needed, thus creating multiple separate power planes. For example, if a MV-to-LV transformer is placed at the end of each row of racks and one row needs excess power while another has a substandard power need, the power cannot easily pass from one row to the next because its flow will be blocked by the transformers. If instead, a common voltage level of power is distributed broadly in a data center in a single common power domain, and is stepped down to low voltage power very close to the servers (e.g., at the top of each rack or at each server), the power can move freely throughout the medium voltage domain. Also, DC power may be used more readily when the power generation is distributed within the facility, as the conductors needed to carry the power are relatively short in such an implementation. As discussed here, for example, single domains of about 10, 20, 30, 50 75, and 100 MW in size, and in ranges whose endpoints are identified by any combination of two of these values, may be employed. Similarly, in a data center in excess of any of those listed sizes, a single common domain can serve at or more than 50, 60, 75, 90, or 100% of the computing load in the data center facility.

The facility 342 may also have a much larger number of electric domains that are much smaller than the single electric domain shown here and much smaller than the large working fluid domain shown here. For example, a single working fluid domain may extend across and serve all of, 90% or more, 75% or more, or 50% or more of the IT load in facility 342, whereas the average electric domain serving IT equipment may server equal to or less than 5%, 2%, 1%, 0.5%, or 0.25%. In absolute terms, the working fluid domain may be equal to or between any two of the following domain sizes for associated electricity that is generated from the working fluid: 20, 30, 50, 60, 75, 80, 90, 100, 150, and 200 MW, while the average domain size for electric domains that are created from the working fluid may be equal to or between any pair of 5 MW, 2 MW, 1 MW, 0.5 MW, 0.25 MW, or 0.1 MW. Similarly, there can be equal to or between 50 and 100 electric domains for the largest working fluid domain in a data center facility, or equal to or between 100 to 200, 100 to 250, 200 to 400, 200 to 500, or 500 to 1000. In particular implementations, the largest working fluid plane or domain may serve equal to or more than 20, 30, 50, 75, 80, 90, or 100 percent of a data center, and the average electric power domain served by the working fluid domain may server less than 20, 10, 5, 2, 1, or 0.5% of the data center, where the data center is equal to or larger than 10 MW, 20 MW, 30 MW, 50 MW, 75 MW, 100 MW, 150 MW, or 200 MW.

In certain instances none of the electric power generating units in a domain will have its output connected to any other unit in the domain. In other instances, the most connected distributed power units that are connected within a working fluid domain of the sizes discussed above may be 2 units, 5 units, 10 units, 20 units, or 50 units.

Figure 4:
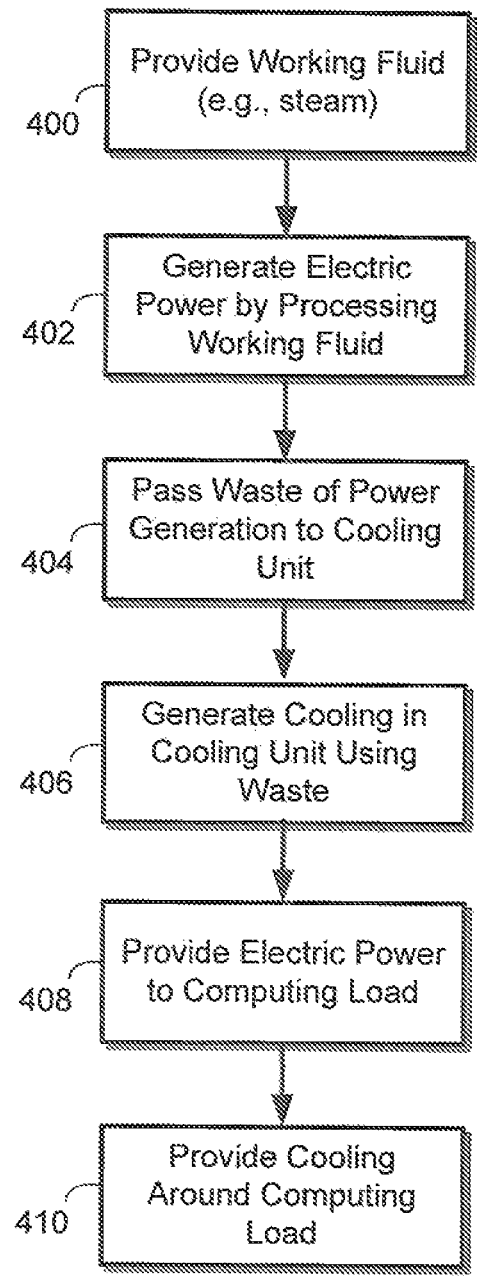
FIG. 4 is a flow chart of a process for providing distributed power and cooling in a data center.

FIG. 4 is a flow chart of a process for providing distributed power and cooling in a data center. In general, the process involves supplying a working fluid to one or more power/cooling units that convert the working fluid to electrical power and cooling of air in a space, and provide such electric power and cooling to loads in the space, such as computer servers, networking equipment, and related equipment.

The process begins at box 400, where a working fluid is provided to a combined power/cooling unit. The unit may be located within a data center facility in a common area with computing loads of the data center facility. Multiple such units may be distributed throughout the facility adjacent to the loads that they serve. For example, dozens or hundreds of such units may be distributed substantially evenly across a large data center, with the density of the units within the data center generally matching the density of electric and cooling loads for the equipment in the data center facility (e.g., the units would be denser in a corner of the data center having servers that generate more heat or racks that space servers more closely to each other). The fluid may be provided in various forms, such as low, medium, or high pressure steam suitable for provision to commercially-available forms of power generation and cooling units.

At box 402, electric power is generated by processing the working fluid. In one example, a working fluid in the form of steam may be fed to a turbine that is powered by steam and is connected to an electric generator to provide rotational force to the generator. Such an electric generation pair may take a variety of familiar forms, and may provide for lightweight and efficient electric generation. The work that is performed by the steam in turning the turbine may lower the pressure of the steam and the temperature of the steam, and make a cause some of the steam to precipitate out as high temperature water.

At box 404 waste from the electric power generation step is passed from the power generation unit to the cooling unit. In the particular example in which steam is used as a working fluid, such waste may be in the form of high temperature water, steam at a lower pressure than was initially provided to the unit, or a combination of the two. Such waste may be passed by a direct conduit connection between the two subunits or by a more indirect mechanism. For example, a system may supply steam to multiple different electrical generation units, and may collect the waste from such steam generation into a common conduit or header for all the units, which header may in turn be connected to a plurality of cooling units. Such a "common" connection may allow better diversity in the availability of fluid for cooling, so that the fluid can be made available to whatever unit currently needs the most cooling, even if that the corresponding electric generation unit that serves the same area of the data center is not currently producing the most usable waste (e.g., because of a time lag between demand for electric power and demand for cooling).

At box 406, cooling is generated in the cooling unit using the waste. In the example discussed here, such cooling may be obtained by way of an absorption chilling process. The heat source for the absorption chiller in the main example here is steam or hot water produced from steam. In other embodiments, such heat source may be generated by using natural gas as a primary fluid for the electrical generation, such as using the gas to drive a turbine connected to a generator. The waste fluid provided for the absorption chiller may then be in the form of heated air (in addition to conductive heating) created by the combustion of the natural gas.

At box 408, electric power is provided to the various computing loads served by the unit. Such provision may be by way of electrical conductors connected, such as by electric plugs, into the unit at one end of the conductors, and connected to power supplies for motherboards at the other end of such conductors. Additional components may also be included between the generator and the loads, such as electric filters, circuit breakers, switches, and transformers. The particular components that are used in a particular implementation will vary based on the needs of the data center equipment and the type of generator that is employed. For example, AC-to-DC rectification may be needed at particular locations, as may various levels of voltage transformation (e.g. one or more step-downs).

At box 410, cooling is provided around the computing load. Such cooling may be provided with air or other gas, liquid, or both. For example, a diffuser may be provided with the cooling unit to spread cooled air into a space that is in communication with air intakes for the various servers in a data center. Such provision of cooled air may simply involve dumping the cool air into an occupied cool area or aisle of a data center so that it can be readily drawn into open front faces of computers in the data center. Provision of liquid cooling may be by In this manner, the process described here may permit for the installation of multiple power units and cooling units distributed substantially evenly across a large area of a data center (e.g., serving more than 50%, 50%, 70% 80%, or 90% of the data center). For example, a large data center (10s of megawatts or more) may have dozens, hundreds or thousands of such units), and combinations of such units may generate electricity and cooling at such distributed locations in the data center facility. The electric generation units may be located close enough to particular racks that they serve so that power may be conveyed conveniently and economically by standard conductors (e.g., extension cords rather than solid bus bars) The cooling units may be located so as to provide adequately even cooling coverage of the data center without the need for substantial supply ductwork to carry the cooled air. And in certain implementations, particular electric generation units and particular cooling units may be connected together and even share a single unit, such as being part of a packaged unit that is manufactured as a single unit off-site and installed as a single unit. Such an approach may also substantially reduce the amount of electrical and HVAC infrastructure that needs to be installed in and contained in a data center space, with the former infrastructure being replaced by piping distribution for the powering fluid.

FIG. 5 is a schematic diagram of a computer system 500. The system 500 can be used for the operations described in association with any of the computer-implement methods described previously, according to one implementation. For example, the system 500 may be used in providing local control for particular ones of or small groups of, combined power/cooling units described above, or in providing master control over an entire data center or multiple data centers of such units. Moreover, the system 500 may describe computing resources that may operate as the loads to be cooled by the systems and methods described above.

The system 500 is intended to include various forms of digital computers, such as laptops, desktops, workstations, personal digital assistants, servers, blade servers, mainframes, and other appropriate computers. The system 500 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of embodiments have been described. Nevertheless, it will be understood that various modifications may be made without departing from the spirit and scope of what is described. For example, the steps of the exemplary flow chart in FIG. 4 may be performed in other orders, some steps may be removed, and other steps may be added. Accordingly, other embodiments are within the scope of the following claims.

What is claimed is:

1. A method for providing for conditioning of a computer data center, the method comprising:
supplying a working fluid from a common fluid plane to a plurality of power/cooling units distributed across a data center facility in proximity to electronic equipment that is distributed across the data center facility, at least one of the power/cooling units comprising an electric generator unit configured to generate electric power from the working fluid and output waste from the working fluid to a cooling unit to generate a cooling fluid from the waste to cool the electronic equipment, and at least one of the power/cooling units further comprise a unitary housing that encloses the electric generator unit and the cooling unit;
converting the working fluid into electric power and cooling capacity at each of the plurality of power/cooling units; and
supplying the electric power to a common electric power plane serving a plurality of racks of the electronic equipment in the data center facility and being served by a plurality of the power/cooling units in the data center facility.

2. The method of claim 1, wherein the common fluid plane serves at least 10 percent of the power/cooling units in the data center facility and the common electric power plane serves at most 5 percent of the electronic equipment in the data center facility, and wherein the data center facility is rated at 10 MW or more.

3. The method of claim 1, wherein the common fluid plane serves at least 90 percent of the power/cooling units in the data center facility and the common electric power plane serves at most 10 percent of the electronic equipment in the data center facility, and wherein the data center facility is rated at more than 10 MW.

4. The method of claim 1, wherein the working fluid comprises a vapor phase and the waste from the working fluid comprises a liquid phase.

5. The method of claim 4, wherein the working fluid comprises steam and the waste comprises hot water produced from the steam.

6. The method of claim 4, wherein the electric generator comprises a steam turbine and the cooling unit comprises an absorption chiller.

7. The method of claim 1, wherein the unitary housing is located at a location within a row of racks that include the one or more racks of computers or at a location above a row of racks that includes the one or more racks of computers.

8. The method of claim 1, further comprising exhausting heat from the power/cooling units to an area external to the data center.

9. A system comprising:
a plurality of power/cooling units distributed across a data center facility in proximity to electronic equipment that is distributed across the data center facility, at least one of the power/cooling units comprising an electric generator unit configured to generate electric power from a working fluid coupled to the power/cooling unit and output waste from the working fluid to a cooling unit to generate a cooling fluid from the waste to cool the electronic equipment, and at least one of the power/cooling units further comprises a unitary housing that encloses the electric generator unit and the cooling unit;

a common working fluid plane defined by a plurality of interconnected conduits arranged to serve a plurality of the power/cooling units; and a common electric energy plane defined by a plurality of interconnected electric conductors and served by a plurality of the power/cooling units.

10. The system of claim 9, wherein the common fluid plane serves at least 10 percent of the power/cooling units in the data center facility and the common electric power plane serves at least 50 percent of the electronic equipment in the data center facility, and wherein the data center facility is rated at more than 10 MW.

11. The system of claim 9, wherein the common fluid plane serves at least 90 percent of the power/cooling units in the data center facility and the common electric power plane serves at least 90 percent of the electronic equipment in the data center facility, and wherein the data center facility is rated at more than 10 MW.

12. The system of claim 9, wherein the working fluid comprises a vapor phase and the waste from the working fluid comprises a liquid phase.

13. The system of claim 9, wherein each of the plurality of power/cooling units comprises:

a conduit connected to receive waste from the electric generator unit that is generated from the working fluid.

14. The system of claim 13, wherein the electric generator unit comprises a steam turbine and the waste comprises hot water produced form the steam, and the cooling unit comprises an absorption chiller.

15. The system of claim 9, wherein the unitary housing is included in a rack arranged to be positioned in a row of computer racks.

16. The system of claim 9, wherein the cooling unit includes a hot air input positioned to obtain hot air from computer racks and a cool air output to supply cooled air to the same computer racks.

17. The system of claim 16, wherein the hot air input for the cooling unit is located on a first side of the housing, and the cool air output for the cooling unit is located on a second side of the housing that is opposite the first side of the housing.

18. The system of claim 9, wherein the unitary housing is located above a row of racks that includes the one or more racks of computers.

19. The system of claim 9, further comprising an exhaust connecting the unitary housing to an area external to the data center.

20. The system of claim 19, wherein the exhaust includes a conduit connected to a hot air plenum in an attic above, or an under-floor space below, the rows of racks of computers in the data center facility.

* * * * *